United States Patent [19]

Hattori

[11] Patent Number: 5,008,738
[45] Date of Patent: Apr. 16, 1991

[54] SEMICONDUCTOR VARIABLE CAPACITANCE ELEMENT

[75] Inventor: Yoshio Hattori, Tokyo, Japan

[73] Assignee: Seiko Instruments Inc., Japan

[21] Appl. No.: 269,435

[22] Filed: Nov. 9, 1988

[30] Foreign Application Priority Data

Nov. 11, 1987 [JP] Japan .................. 62-284862

[51] Int. Cl.⁵ ............... H01L 29/78; H01L 29/68; H01L 29/92
[52] U.S. Cl. .................. 357/23.6; 357/23.5; 357/14
[58] Field of Search .............. 357/23.6, 23.5, 14

[56] References Cited

U.S. PATENT DOCUMENTS 4,199,772 4/1980 Natori .................. 357/23.6
4,816,894 3/1989 Hattori ................. 357/23.6

FOREIGN PATENT DOCUMENTS 62-179162 8/1987 Japan .

Primary Examiner—Rolf Hille
Assistant Examiner—Wael Fahmy
Attorney, Agent, or Firm—Bruce L. Adams; Van C. Wilks

[57] ABSTRACT

A semiconductor variable capacitance element can provide a stable capacitance value by making a direct current voltage constant applied between a capacitive region and a first capacitance electrode. The capacitive region is formed under the surface of a semiconductor substrate and the first capacitance electrode is capacitively coupled to a floating electrode insulated from the semiconductor substrate. The floating electrode stores electric charge to build up an electrical potential in the floating electrode according to the stored amount of electric charge to thereby determine an amount of capacitance of the capacitive region.

15 Claims, 4 Drawing Sheets

SEMICONDUCTOR VARIABLE CAPACITANCE ELEMENT

BACKGROUND OF THE INVENTION

1. Field of the Invention

The present invention relates to semiconductor variable capacitance element for controlling a capacitance by an electric charge stored in a floating electrode covered by an insulating film and insulated from the outside, the floating electrode being disposed on the surface of a semiconductor substrate through the insulating film.

2. Description of the Related Art

A semiconductor variable capacitance element has been known as disclosed in a literature "Proceedings vol. 2, 11th INTERNATIONAL CONGRESS of CHRONOMERY, edited by the French Society of Michrotechnology and chronometry, p. 9, '84".

FIG. 3 is a sectional view showing the conventional semiconductor variable capacitance element. As shown in FIG. 3, the semiconductor variable capacitance element comprises a p-type semiconductor substrate 31, a floating electrode 33 disposed on and electrically insulated from the semiconductor substrate for storing electric charge to form a depletion layer capacitive region 30 in the semiconductor substrate, a charge control electrode 37 formed in a portion of the semiconductor substrate for injecting electric charge into the floating electrode, and a capacitance electrode 35 formed in a portion of the semiconductor substrate and capacitively coupled to the floating electrode 33. The floating electrode is covered by an insulating film 32 and insulated from the outside. The charge control electrode 37 is composed of a heavily doped P+ region in an n-well diffusion region. The capacitance electrode 35 is composed a heavily doped n+ region in an n-well diffusion region 34. Resistances 38 and 39 are protecting resistances for protecting the insulating film 32 from electrostatic discharge. The semiconductor variable capacitance element has a capacitance value between the heavily doped n+ region 35 and the semiconductor substrate 31. The capacitance value of the semiconductor variable capacitance element changes dependent on the electric potential of the floating electrode produced by the electric charge accumulated in the floating electrode 33. A maximum capacitance value thereof is determined based on an area of the floating electrode and an area of the capacitance electrode and a minimum capacitance value thereof is determined based on the areas and a minimum value of the depletion layer capacitance 30, i.e., a maximum value of a width of the depletion layer.

In the semiconductor variable capacitance element, the depletion layer capacitance 30 produced on the surface of the semiconductor substrate under the floating electrode 33 is controlled by the electric potential of the floating electrode 33 produced by the electric charge accumulated in the floating electrode 33. The floating electrode 33 and the capacitance electrode 35 have a strong capacitive coupling so that the electric potential of the floating electrode 33 is affected by a voltage of the capacitance electrode 35.

Conventionally, since a terminal 36 of the capacitance electrode 35 is connected to an external circuit directly, a bias voltage from the circuit is directly applied to the capacitance electrode 35. Thus, there is a drawback that when the capacitance value is changed by a change in the bias voltage from the circuit or when the bias voltage from the circuit is high, a high voltage is applied to the p-type diffusion region 35 and the floating electrode 33 so that the accumulated electric charge is changed by a fine tunnel current flowing to the floating electrode 33 and the capacitance value is also gradually changed with aging.

Semiconductor variable capacitance elements as shown in FIG. 3 are disclosed in the commonly assigned following applications, which are incorporated herein by reference: Ser. No. 008,290 filed Jan. 29, 1987, now U.S. Pat. No. 4,816,894; and Ser. No. 036,285 filed Apr. 9, 1987. The semiconductor variable capacitance elements perform analog tuning of the capacitance value by utilizing a floating gate memory device.

SUMMARY OF THE INVENTION

In order to solve the above described problem of the conventional semiconductor variable capacitance elements, an object of the present invention is to make a voltage between the floating electrode and the capacitance electrode constant by applying a bias voltage between a capacitive region where a depletion layer is produced by the electric charge accumulated in the floating electrode and the capacitance electrode capacitively coupled to the floating electrode or connecting a resistance between the floating electrode and the capacitance electrode for making a self bias.

With the inventive arrangement, since a small constant bias voltage can be applied to the aforesaid floating electrode, the electric potential of the floating electrode is stabilized and leakage current from the floating electrode is restricted, whereby a semiconductor variable capacitance element having a stable capacitance value without aging can be realized.

In accordance with the present invention, there is provided a semiconductor variable capacitance element comprising a semiconductor substrate having a major surface and a capacitive region under the major surface of the semiconductor substrate, an insulating film disposed on the major surface of the semiconductor substrate, a floating electrode for storing electric charge to build up an electrical potential in the floating electrode to determine an amount of capacitance of the capacitive region, a charge control electrode formed in the semiconductor substrate, a first capacitance electrode capacitively coupled to the floating electrode, blocking means for blocking an application of a DC voltage from the external circuit between the capacitive region and the first capacitance electrode, and bias means for applying a bias voltage between the capacitive region and the first capacitance electrode.

The semiconductor variable capacitance element according to the present invention can provide a stable capacitance value without being affected by an external bias voltage applied to the semiconductor variable capacitance element by making a direct current voltage constant which is applied between the capacitive region producing a depletion layer capacitance and the first capacitance electrode which is capacitively coupled with the floating electrode through a thin insulating film.

Further, another object of the present invention is to realize an excellent semiconductor variable capacitance element capable of making a capacitance value variable by controlling a direct current bias voltage applied between the capacitive region and the first capacitance electrode.

DESCRIPTION OF THE PREFERRED EMBODIMENTS

The present invention will be described below in specific detail with reference to several embodiments.

Figure 1:
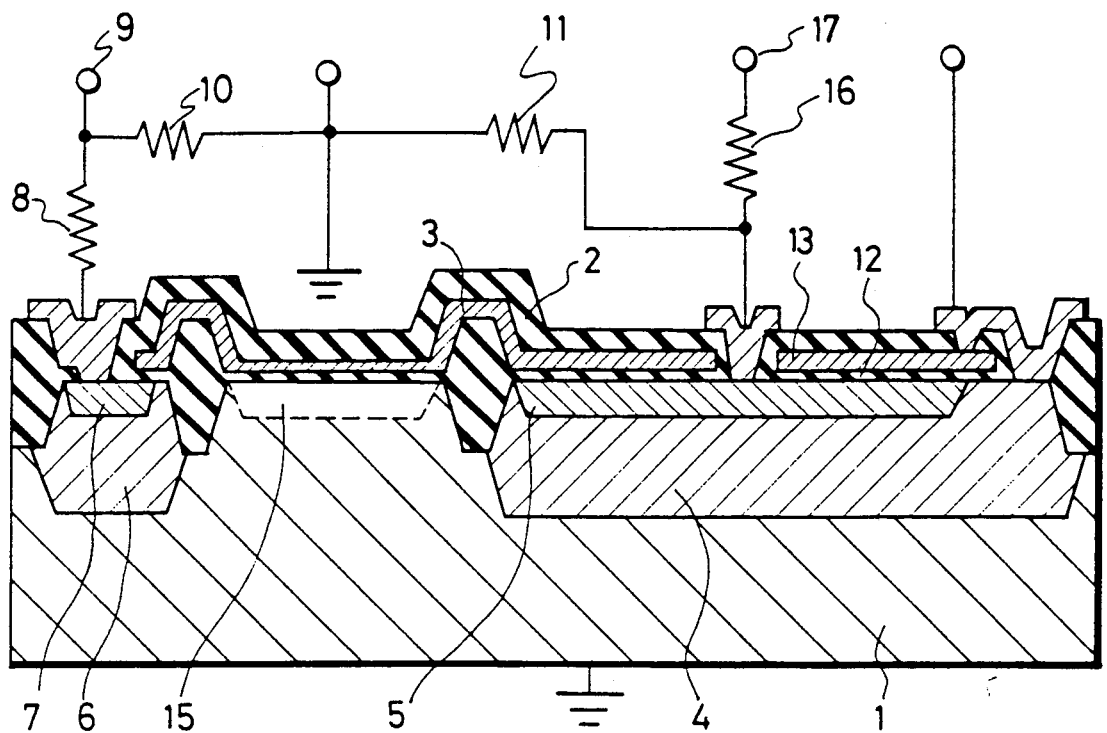
FIG. 1 is a sectional view illustrative of the structure of a first embodiment of the present invention.

FIG. 1 is a sectional view illustrative of the structure of a first embodiment of the present invention. A floating electrode 3 surrounded by an insulating film 2 and insulated from the outside is deposited on a surface of a semiconductor substrate 1 and first capacitance electrode 5 which is in a capacitive coupling with the floating electrode 3 through a thin insulating layer is formed in a diffusion region of the same electric conductivity type as that of the semiconductor substrate 1 on a second capacitance electrode 4 formed in a well diffusion region with an electric conductivity type opposite to that of the semiconductor substrate 1 on the surface of the semiconductor substrate 1. Further, a charge control electrode 7 for controlling an electric charge accumulated in the floating electrode 3 is formed on the surface of the semiconductor substrate 1 in a diffusion region of the same electric conductivity type as that of the semiconductor substrate 1 in a well diffusion region 6 of the electric conductivity type opposite to that of the semiconductor substrate 1. The charge control electrode 7 is connected to a capacitance variable terminal 9 through a protection resistance 8 and the capacitance variable terminal 9 is connected to the semiconductor substrate 1 through a protection resistance 10. The protection resistance 8 and the protection resistance 10 are used for protecting the insulating layer surrounding the floating electrode 3 from electrostatic discharge.

The semiconductor substrate 1 is connected to the first capacitance electrode 5 through a resistance 11 for cutting an alternating current. Further, a MOS capacitance 13 formed through a thin insulating layer 12 on the first capacitance electrode 5 is connected to the second capacitance electrode 4. The second capacitance electrode 4 serves as an external terminal(anode) for taking out a capacitance value of the semiconductor variable capacitance element of the first embodiment.

The MOS capacitance 13 and the second capacitance electrode 4 form a direct current cut capacitance for not transmitting a bias voltage imposed on the external terminal(anode) to the semiconductor substrate 1 and the first capacitance electrode 5.

The capacitance variable electrode 7 is used to control the electric charge accumulated in the floating electrode 3. When any one of a positive or negative high voltage is applied to the capacitance variable terminal 9, a tunnel current is supplied to a very thin insulating layer between the floating electrode 3 and the charge control electrode 7 to cause the electric charge stored in the floating electrode 3 to be changed. A capacitive region 15 of depletion layer capacitance under the major surface of the semiconductor substrate 1 is changed depending on the electric potential of the floating electrode 3 which changes in accordance with the electric charge accumulated in the floating electrode 3. As a result, a capacitance value (capacitance value between the semiconductor substrate 1 and the second capacitance electrode 4) of the semiconductor variable capacitance element of the first embodiment can be arbitrarily changed by changing the electric charge accumulated in the floating electrode 3. In addition, since the floating electrode 3 is surrounded by the insulating layer of an excellent dielectric property(e.g., an oxide layer), the accumulated electric charge does not change with aging so long as a variable voltage pulse is not applied to the capacitance variable terminal 9. Therefore, the capacitance value once set of the semiconductor variable capacitance element of the first embodiment does not change so long as the variable voltage pulse is not applied to the capacitance variable terminal 9.

With the first embodiment, since the first capacitance electrode 5 is connected to the semiconductor substrate 1 through the resistance 11 and kept at the same electric potential with that of the semiconductor substrate 1, a direct current bias voltage applied to the external terminal(anode) is only applied to a capacitance composed of a joint capacitance between the first cacitance electrode 5, and the second capacitance electrode and the MOS capacitance 13 and the direct current bias voltage applied to the external terminal(anode) does not affect the electric potential of the floating electrode 3. Consequently, even if the direct current bias voltage applied to the external terminal(anode) changes, the capacitance value once set of the semiconductor variable capacitance element of the first embodiment does not change so long as the variable voltage pulse is not applied to the capacitance variable terminal 9.

The capacitance value of the semiconductor variable capacitance element of the first embodiment can be arbitrarily changed by changing the electric charge accumulated in the floating electrode 3 through the variable voltage pulse applied to the capacitance variable terminal 9. Concurrently, with the first embodiment, the capacitance value of the semiconductor variable capacitance element of the first embodiment can also be controlled in such a manner that a bias terminal 17 is provided though a resistance 16 and the electric potential of the floating electrode 3 is controlled by a bias voltage applied to the bias terminal 17. When the bias voltage is applied to the bias terminal 17, the resistance 11 can be dispensed with.

Figure 2:
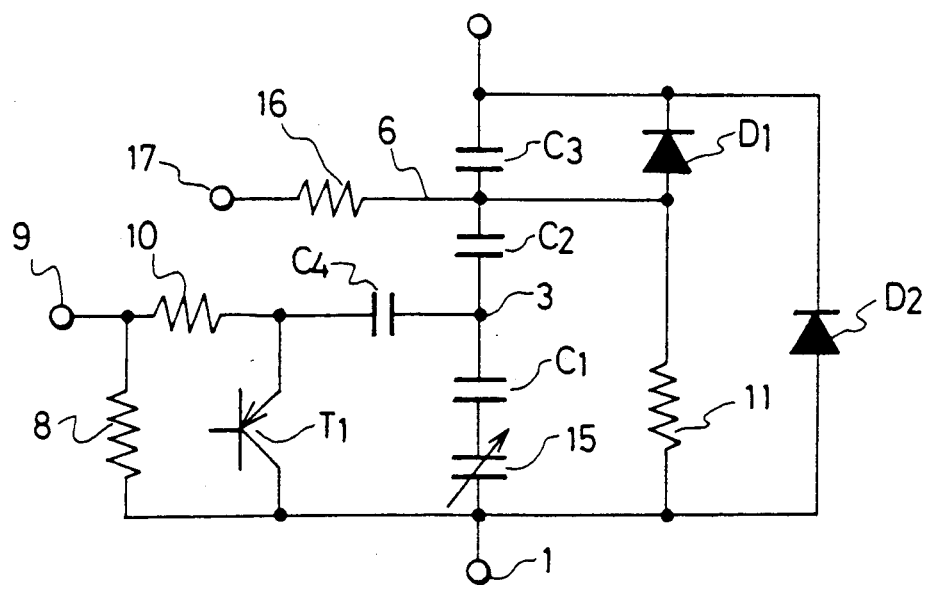
FIG. 2 is a circuit diagram illustrative of an equivalent circuit of the first embodiment of the present invention.
Figure 3:
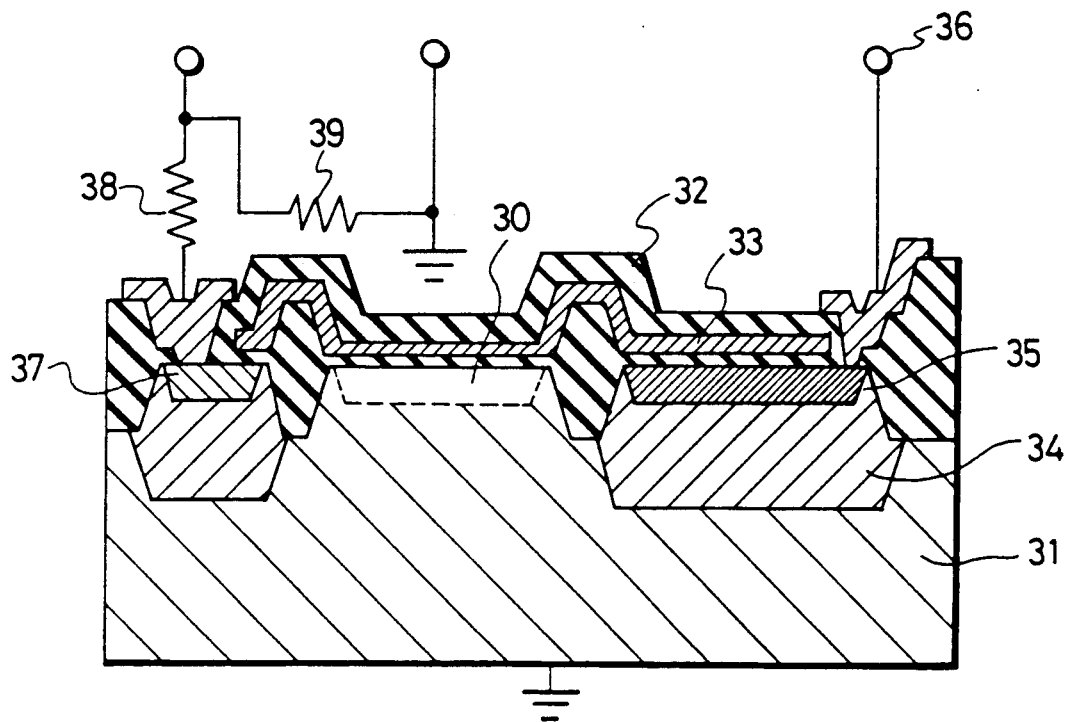
FIG. 3 is a sectional view illustrative of the structure of a conventional semiconductor variable capacitance element.

FIG. 2 is a circuit diagram illustrative of an equivalent circuit of the first embodiment of the present invention. Denoted at C3 is a capacitance of the second capacitance electrode 4 and the first capcitance electrode 5, denoted at C2 is a capacitance of the first capacitance electrode 5 and the floating electrode 3, denoted at C1 is a capacitance between the floating electrode 3 and the thin insulating layer on the surface of the semiconductor substrate 1 and denoted at 15 is the depletion layer capacitance under the capacitance C1 which is changed by the electric charge stored in the floating electrode 3 on the surface of the semiconductor substrate 1. Denoted at D1 is a diode for the second capacitance electrode 4 and the first capacitance electrode 5 and denoted at D2 is a diode for the second capacitance electrode 4 and the semiconductor substrate 1. Further, denoted at C4 is a capacitance for a region of the thin insulating layer between the floating electrode 3 and the charge control electrode 7 to which a tunnel current is supplied and T1 is a bipolar transistor having an emitter as the variable capacitance electrode 7, a base as the well diffusion region 6 and a collector as the semiconductor substrate 1 and the base of the T1 is floating. The charge control electrode 7 has the resistance 10 connected thereto to be the capacitance variable terminal 9 and the resistance 8 is connected between the variable terminal 9 and the semiconductor substrate 1. In addition, the resistance 11 is connected between the first capacitance electrode 5 and the semiconductor substrate 1 and also connected from the first capacitance electrode 5 to the bias terminal 17 through the resistance 16.

As apparent from the equivalent circuit in FIG. 2, since the first capacitance electrode 5 and the semiconductor substrate 1 are of the same electric potential by being connected through the resistance 11 or they are made constant by the bias voltage applied to the bias terminal 17, a voltage applied to the semiconductor variable capacitance element of the first embodiment-(voltage applied between the second capacitance electrode 4(anode) and the semiconductor substrate 1(cathode)) is applied to the capacitance C3 and the diodes D1, D2 and does not affect the electric potential of the floating electrode 3.

Figure 4:
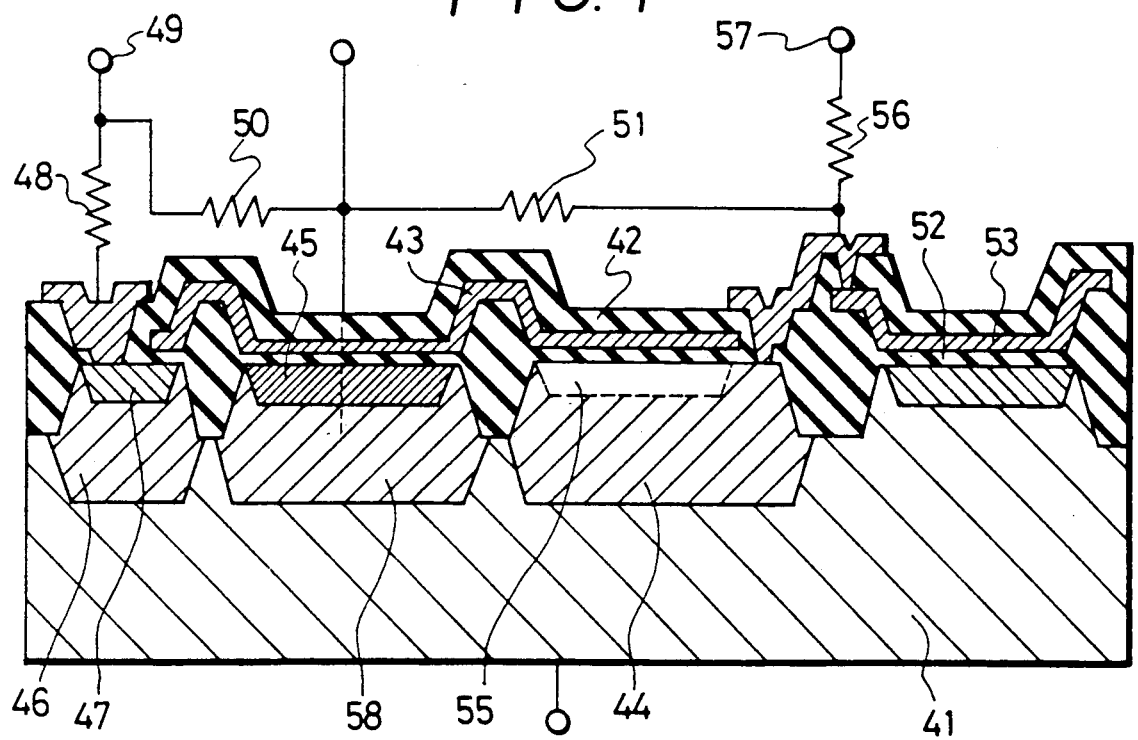
FIG. 4 is a sectional view of a semiconductor variable capacitance element of a second embodiment of the present invention.

FIG. 4 is a sectional view illustrative of a second embodiment of the present invention. A floating electrode 43 is covered by a dielectric layer 42 and insulated from the outside is deposited on the surface of a semiconductor substrate 41 and a first capacitance electrode 45 which is in a capacitive coupling with the floating electrode 43 through a thin insulating layer is formed in a well diffusion region 58 of an electric conductivity type opposite to that of the semiconductor substrate 41 on the surface of the semiconductor substrate 41. The first capacitance electrode 45 has a high impurity concentration in the surface thereof not to produce a depletion layer capacitance by an electric charge accumulated in the floating electrode 43.

A well region 44 of opposite conductivity type to that of the semiconductor substrate 41 is formed in the semiconductor substrate 41. A capacitive region 55 is defined in the well region 44 by electric charge accumulated in the floating electrode 43, so a depletion layer capacitance is produced. Further, a charge control electrode 47 for controlling an electric charge accumulated in the floating electrode 43 is formed on the surface of the semiconductor substrate 41 in a diffusion region of the same electric conductivity type as that of the semiconductor substrate 41 in a well diffusion region 46 of the electric conductivity type opposite to that of the semiconductor substrate 41. The charge control electrode 47 is connected to a capacitance variable terminal 49 through a resistance 48 and the capacitance variable terminal 49 is connected to the first capacitance electrode 45 through a resistance 50. The resistance 48 and the resistance 50 are used for protecting the dielectric layer surrounding the floating electrode 43 from electrostatic discharge. The first capacitance electrode 45 is connected to the well region 44 through a resistance 51 and they are of the same electric potential in a direct current. Further, a MOS capacitance electrode 53 formed through a thin insulating layer 52 on a surface of the semiconductor substrate 41 is connected to the second capacitance electrode 44. The semiconductor substrate 41 serves as an anode for a semiconductor variable capacitance element of the second embodiment. The first capacitance electrode 45 serves as a cathode.

Like the first embodiment, the charge control electrode 47 is used to control the electric charge accumulated in the floating electrode 43. When any one of a positive or negative high voltage is applied to the capacitance variable terminal 49, a tunnel current is supplied to a very thin oxide layer between the floating electrode 43 an the charge control electrode 47 to cause the electric charge accumulated in the floating electrode 43 to be changed. The depletion layer capacitance 55 on the surface of the well region 44 is changed depending on the electric potential of the floating electrode 43 which changes in accordance with the electric charge accumulated in the floating electrode 43. As a result, a capacitance value(capacitance value between the semiconductor substrate 41 and the first capacitance electrode 45) of the semiconductor variable capacitance element of the second embodiment can be arbitrarity changed by changing the electric charge accumulated in the floating electrode 43. In addition, since the floating electorde 43 is surrounded by the dielectric layer of an excellent dielectric property(e.g., an oxide layer), the accumulated electric charge does not change with aging so long as a variable voltage pulse is not applied to the capacitance variable terminal 49. Therefore, the capacitance value once set of the semiconductor variable capacitance element of the second embodiment does not change with aging so long as the variable voltage pulse is not applied to the capacitance variable terminal 49.

With the second embodiment, since the first capacitance electrode 45 is kept at the same electric potential with that of the second capacitance electrode 44 by the resistance 55, a direct current bias voltage applied between the semiconductor substrate 41 and the first capacitance electrode 45 does not affect the electric potential of the floating electrode 43. Consequently, even if the direct current bias voltage applied to the external terminal(anode) changes, the capacitance value once set of the semiconductor variable capacitance element of the second embodiment does not change so long as the variable voltage pulse is not applied to the capacitance variable terminal 49.

The capacitance value of the semiconductor variable capacitance element of the second embodiment can be arbitrarity changed by changing the electric charge accumulated in the floating electrode 43 through the variable voltage pulse applied to the capacitance variable terminal 49. Concurrently, with the second embodiment, the capacitance value of the semiconductor variable capacitance element can also be controlled in such a manner that a bias terminal 57 is provided though a resistance 56 and the electric potential of the floating electrode 43 is controlled by a bias voltage applied to the bias terminal 57. When the bias terminal 57 is supplied with the bias voltage, the resistance 51 can be dispensed with.

As described above, in the second embodiment, the blocking means comprises a junction capacitance between the well region 44 and the semiconductor substrate 41, and MOS capacitance electrode 53 formed in the insulating film 42. The well region 44 is electrically connected to the MOS capacitance electrode 53.

Figure 5:
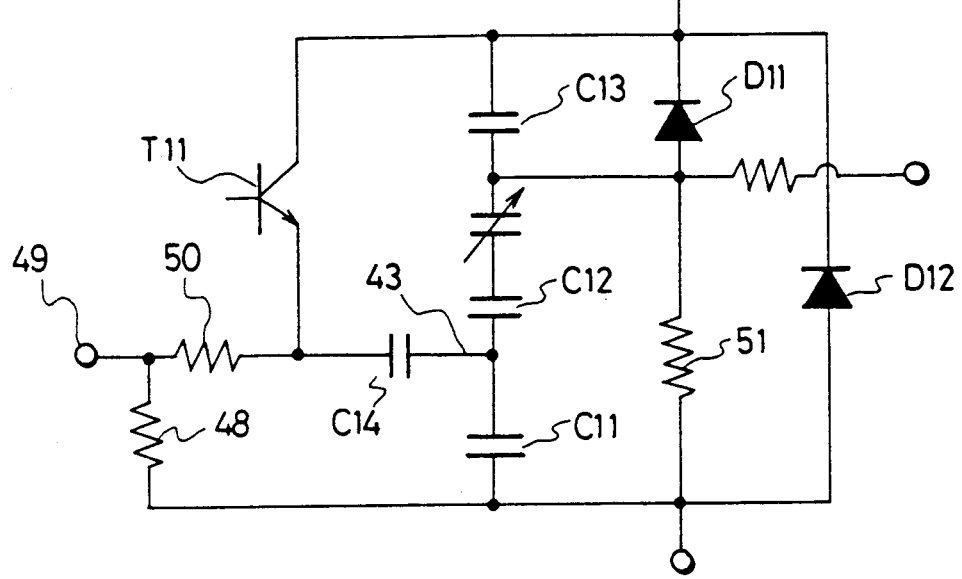
FIG. 5 is a circuit diagram illustrative of an equivalent circuit of the second embodiment of the present invention.

FIG. 5 is a circuit diagram illustrative of an equivalent circuit of the second embodiment of the present invention. Denoted at C11 is a capacitance for the first capacitance electrode 45 and the floating electrode 43, denoted at C12 is a capacitance for the floating electrode 43 and the well region 44, and denoted at C13 is a capacitance for the second capacitance electrode 44 and the semiconductor substrate 41. Denoted at 55 is a depletion layer capacitance on the surface of the well diffusion region of the well region 44 which is changed by the electric charge accumulated in the floating electrode 43. Denoted at D11 is a diode for the well region 44 and the semiconductor substrate 41 which is connected to the capacitance C13 in parallel. Denoted at 12 is a diode for the first capacitance electrode 45 and the semiconductor substrate 41. Further, denoted at C14 is a capacitance for the thin dielectric layer between the floating electrode 43 and the charge control electrode 47 to which a tunnel current is supplied and denoted at T11 is a bipolar transistor having an emitter as the charge control electrode 47, a base as the well diffusion region 46 and a collector as the semiconductor substrate 41 and the base of the transistor T11 is floating. The charge control electrode 47 has the resistance 50 connected thereto to be the capacitance variable terminal 49 and the resistance 48 is connected between the variable terminal 49 and the semiconductor substrate 41. In addition, the resistance 51 is connected between the first capacitance electrode 45 and the well region 44 and also connected from the first capacitance electrode 45 to the bias terminal 57 through the resistance 56.

As apparent from the equivalent circuit in FIG. 5, since the first capacitance electrode 45 and the semiconductor substrate 41 are of the same electric potential by being connected through the resistance 51 or they are made constant by the bias voltage applied to the bias terminal 57, a voltage applied to the semiconductor variable capacitance element of the second embodiment (voltage applied between the first capacitance electrode 45 (cathode) and the semiconductor substrate 41(anode)) is applied to the capacitance C13 and the diodes D11, D12 and does not affect the electric potential of the floating electrode 43.

Figure 6:
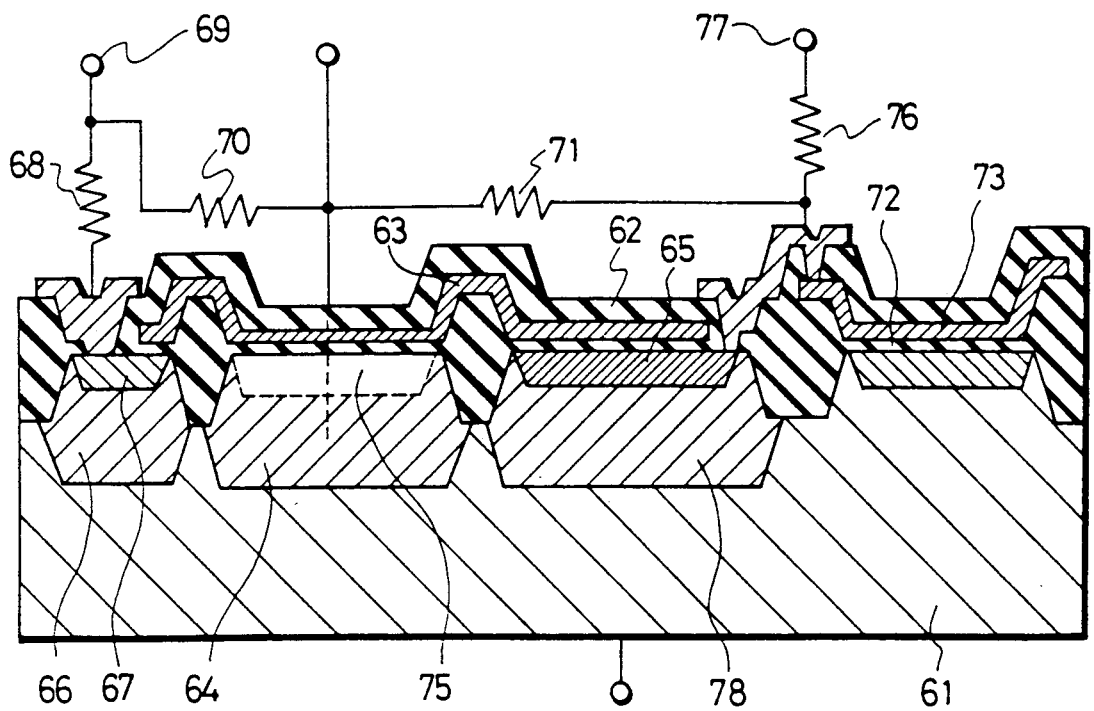
FIG. 6 is a sectional view of a semiconductor variable capacitance element of a third embodiment of the present invention.

FIG. 6 is a sectional view illustrative of a third embodiment of the present invention. A floating electrode 63 surrounded by an insulating film 62 and insulated from the outside is deposited on a surface of a semiconductor substrate 61 and a first capacitance electrode 65 which is capacitively coupled with the floating electrode 63 through a thin insulating layer is formed on the surface of the semiconductor substrate 61 in a well diffusion region 78 of an electric conductivity type opposite to that of the semiconductor substrate 61. The first capacitance electrode 65 has a high impurity concentration in the surface thereof so as not to produce a depletion layer capacitance by an electric charge accumulated in the floating electrode 63.

A well region 64 of opposite conductivity type to that of the semiconductor substrate 61 is formed in the semiconductor substrate. A capacitive region 75 is defined in the well region 64 by electric charge accumulated in the floating electrode 63, so a depletion layer capacitance is produced. Further, a charge control electrode 67 for controlling the electric charge accumulated in the floating electrode 63 is formed on the surface of the semiconductor substrate 61 in a diffusion region of the same electric conductivity type as that of the semiconductor substrate 1 in a well diffusion region 66 of the electric conductivity type opposite to that of the semiconductor substrate 61. The charge control electrode 67 is connected to a capacitance variable terminal 69 through a resistance 68 and the capacitance variable terminal 69 is connected to the well region 64 through a resistance 70. The resistance 68 and the resistance 70 are used for protecting the insulating layer surrounding the floating electrode 63 from electrostatic discharge. The first capacitance electrode 65 is connected to the well region 64 through a resistance 71 and they are of the same electric potential in a direct current. Further, a MOS capacitance electrode 73 formed through a thin insulating layer 72 on the surface of the semiconductor substrate 61 is connected to the first capacitance electrode 65. The semiconductor substrate 61 serves as an anode for a semiconductor variable capacitance element of the third embodiment. The well region 64 serves as a cathode.

Like the second embodiment, the charge control electrode 67 is used to control the electric charge accumulated in the floating electrode 63. When any one of a positive or negative high voltage is applied to the capacitance variable terminal 69, a tunnel current is supplied to a very thin dielectric layer between the floating electrode 63 and the capacitance variable electrode 67 to cause the electric charge accumulated in the floating electrode 63 to be changed. A depletion layer capacitance of the capacitive region 75 is changed depending on the electric potential of the floating electrode 63 which changes in accordance with the electric charge accumulated in the floating electrode 63. As a result, a capacitance value junction(capacitance value between the semiconductor substrate 61 and the well region 64) of the semiconductor variable capacitance element of the third embodiment can be arbitrarily changed by changing the electric charge accumulated in the floating electrode 63. In addition, since the floating electrode 63 is surrounded by the insulating layer of an excellent dielectric property(e.g., an oxide layer), the accumulated electric charge does not change with aging so long as a variable voltage pulse is not applied to the capacitance variable terminal 69. Therefore, the capacitance value once set of the semiconductor variable capacitance element of the third embodiment does not change with aging so long as the variable voltage pulse is not applied to the capacitance variable terminal 69.

With the third embodiment, since the first capacitance electrode 65 is kept at the same electric potential with that of the well region 64 by the resistance 71, a direct current bias voltage applied between the semiconductor substrate 61 and the well region 64 does not affect the electric potential of the floating electrode 63. Consequently, even if the direct current bias voltage applied to the external terminal(anode) changes, the capacitance value once set of the semiconductor variable capacitance element of the third embodiment does not change so long as the variable voltage pulse is not applied to the capacitance variable terminal 69.

The capacitance value of the semiconductor variable capacitance element of the third embodiment can be arbitrarily changed by changing the electric charge accumulated in the floating electrode 63 through the variable voltage pulse applied to the capacitance variable terminal 69. Concurrently, with the third embodiment, the capacitance value of the semiconductor variable capacitance element of the third embodiment can also be controlled in such a manner that a bias terminal 77 is provided through a resistance 76 and the electric potential of the floating electrode 63 is controlled by a bias voltage applied to the bias terminal 67. When the bias terminal 77 is supplied with the bias voltage, the resistance 71 can be dispensed with.

As described above, in the third embodiment, the blocking means for blocking an application of a DC voltage from the external circuit comprises the first capacitance electrode 65 and MOS capacitance electrode 73 formed in the insulating film 62. The MOS capacitance electrode 73 is connected to the first capacitance electrode 65.

Figure 7:
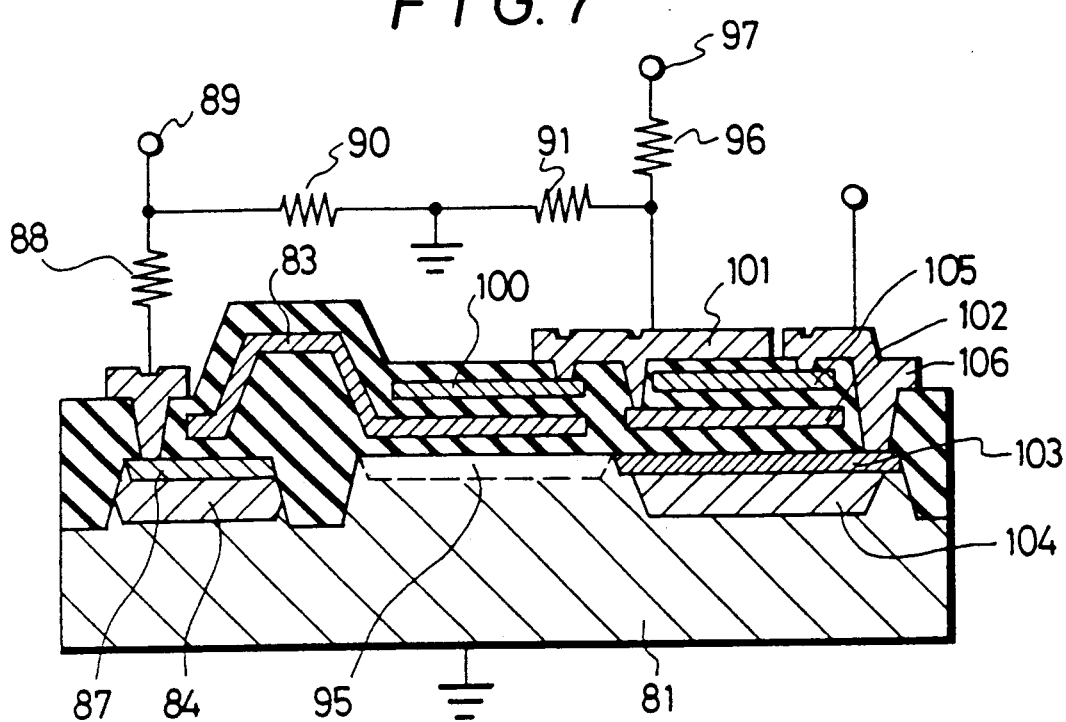
FIG. 7 is a sectional view of a semiconductor variable capacitance element of a fourth embodiment of the present invention.

FIG. 7 is a secional view illustrative of the structure of the fourth embodiment of the present invention. A floating electrode 83 covered by an insulating film 82 and insulated from the outside is provided on a surface of a semiconductor substrate 81 and there is formed a first capacitance electrode 100 which is capacitively coupled with the floating electrode 83 through a thin insulating layer. The first electrode 100 is connected to a MOS capacitance electrode 102 through a wiring 101. A second capacitance electrode 103 made of a heavily doped diffusion region which is of an opposite conductivity type to that of the semiconductor substrate 81 is formed in a well diffusion region 104 of an opposite conductivity type to that of the semiconductor substrate 81. The second capacitance electrode 103 is provided under the surface of the semiconductor substrate 81 through the thin insulating layer. The well diffusion region 104 is provided in order to reduce a junction capacitance between the second capacitance electrode 103 and the semiconductor substrate 81.

Further, a MOS capacitance electrode 105 is formed on the electrode 102 though a thin insulating layer, and the electrode 105 is connected to the second capacitance electrode 103 though a wiring 106. Further, a charge control electrode 87 for controlling an electric charge accumulated in the floating electrode 83 is formed on the surface of the semiconductor substrate 81 in a diffusion region of the same electric conductivity type as the semiconductor substrate 81 in a well diffusion region 86 of the electric conductivity type opposite to that of the semiconductor substrate 81. The charge control electrode 87 is connected to a capacitance variable terminal 89 through a resistance 88 and the capacitance variable terminal 89 is connected to the semiconductor substrate 81 through a resistance 90. The resistance 88 and the resistance 90 are used for protecting the insulating layer surrounding the floating electrode 83 from electrostatic discharge. In addition, the semiconductor substrate 81 is connected to the first capacitance electrode 100 though a resistance 91 for cutting an alternating current. The second capacitance electrode 103 comprises a blocking means for blocking a bias voltage applied to the second capacitance electrode 103 to the semiconductor substrate 81 and the first capacitance electrode 100.

The charge control electrode 87 is used to control the electric charge accumulated in the floating electrode 83. When any one of a positive or negative high voltage is applied to the capacitance variable terminal 89, a tunnel current is supplied to a very thin dielectric layer between the floating electrode 83 and the charge control electrode 87 to cause the electric charge accumulated in the floating electrode 83 to be changed. A depletion layer capacitance of a capacitive region 95 on the surface of the semiconductor substrate 81 is changed depending on the electric potential of the floating electrode 83 which changes in accordance with the electric charge accumulated in the floating electrode 83. As a result, a capacitance value(capacitance value between the semiconductor substrate 81 and the second capacitance electrode 103) of the semiconductor variable capacitance element of the fourth embodiment can be arbitrarity changed by changing the electric charge accumulated in the floating electrode 83. In addition, since the floating electrode 83 is surrounded by the insulating layer of an excellent dielectric property (e.g., an oxide layer), the accumulated electric charge does not change with aging so long as a variable voltage pulse is not applied to the capacitance variable terminal 89. Therefore, the capacitance value once set of the semiconductor variable capacitance element of the fourth embodiment does not change so long as the variable voltage pulse is not applied to the capacitance variable terminal 89.

The capacitance value of the semiconductor variable capacitance element of the fourth embodiment can be arbitrarily changed by changing the electric charge accumulated in the floating electrode 83 through the variable voltage pulse applied to the capacitance variable terminal 89. Concurrently, with the fourth embodiment, the capacitance value of the semiconductor variable capacitance element can also be controlled in such a manner that a bias terminal 97 is provided though a resistance 96 and the electric potential of the floating electrode 83 is controlled by a bias voltage applied to the bias terminal 97. When the bias voltage is applied to the bias terminal 97, the resistance 91 can be dispensed with.

Figure 8:
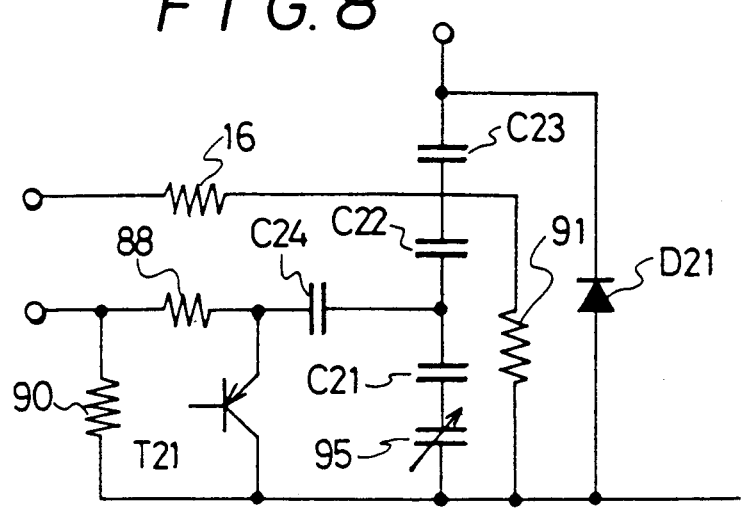
FIG. 8 is a circuit diagram illustrative of an equivalent circuit of the fourth embodiment of the present invention.

FIG. 8 is a circuit diagram illustrative of an equivalent circuit of the fourth embodiment of the present invention. Denoted at C21 is a capacitance of the thin insulating layer between the floating electrode 83 and the semiconductor substrate 81 and denoted at 95 is a depletion layer capacitance on the surface of the semiconductor substrate under the capacitance C21 which is changed by the electric charge accumulated in the floating electrode 83. Denoted at C22 is a capacitance for the first capacitance electrode 100 and the floating electrode 83, denoted at C23 is a capacitance for the second capacitance electrode 103 and the first capacitance electrode 100 and denoted at D21 is a diode for the diffusion region of the second capacitance substrate 103 and the semiconductor electrode 81. Further, denoted at C24 is a capacitance for a region of the thin dielectric layer between the floating electrode 83 and the charge control electrode 87 to which a tunnel current is supplied and T21 is a bipolar transistor having an emitter as the charge control electrode 87, a base as the well diffusion region 86 and a collector as the semiconductor substrate and the base of the T21 is floating. The charge control electrode 87 is connected to the resistance 88 which is connected to the capacitance variable terminal 89 and the resistance 90 is connected between the capacitance variable terminal 89 and the semiconductor substrate 81. In addition, the resistance 91 is connected between the first capacitance electrode 100 and the semiconductor substrate 81 and also connected from the first capacitance electrode 100 to the bias terminal 97 through the resistance 96.

As apparent from the equivalent circuit in FIG. 8, since the first capacitance electrode 100 and the semiconductor substrate 81 are of the same electric potential by being connected through the resistance 91 or they are made constant by the bias voltage applied to the bias terminal 97, a voltage applied to the semiconductor variable capacitance element of the fourth embodiment (voltage applied between the second capacitance electrode 103 and the semiconductor substrate 81) is applied to the capacitance C23 and the diodes D21 and does not affect the electric potential of the floating electrode 83.

What is claimed is:

1. A semiconductor variable capacitance element electrically connectable to an external circuit, comprising:
    a semiconductor substrate having a major surface and a capacitive region under the major surface of the semiconductor substrate;
    an insulating film disposed on the major surface of the semiconductor substrate;
    a floating electrode disposed on the insulating film and electrically insulated from the semiconductor substrate through the insulating film for storing electric charge to build up an electrical potential in the floating electrode according to the stored amount of electric charge to thereby determine the amount of capacitance of the capacitive region;
    a charge control electrode formed in the semiconductor substrate for injecting electric charge into the floating electrode;
    a first capacitance electrode electrically insulated from the semiconductor substrate through the insulating film and capacitively coupled to the floating electrode;
    blocking means for blocking an application of a DC voltage from the external circuit between the first capacitance electrode and the capacitive region; and
    bias means for applying a bias voltage between the capacitive region and the first capacitance electrode.

2. A semiconductor variable capacitance element as claimed in claim 1; wherein the bias means comprises a resistance connected in parallel between the capacitive region and the first capacitance electrode.

3. A semiconductor variable capacitance element as claimed in claim 1; wherein the first capacitance electrode is formed on the floating electrode through the insulating film.

4. A semiconductor variable capacitance element as claimed in claim 1; wherein the blocking means comprises a second capacitance electrode and a MOS capacitance electrode formed in the insulating film.

5. A semiconductor variable capacitance element as claimed in claim 3; wherein the blocking means comprises a second capacitance electrode formed in the semiconductor substrate and a MOS capacitance electrode electrically insulated from the semiconductor substrate through the insulating film and electrically connected to the second capacitance electrode.

6. A semiconductor variable capacitance element as claimed in claim 5; wherein the second capacitance electrode is formed in a surface portion of the semiconductor substrate and comprises a heavily doped diffusion region of opposite conductivity type to that of the semiconductor substrate.

7. A semiconductor variable capacitance element as claimed in claim 1; wherein the charge control electrode comprises a diffusion region of the same conductivity type to that of the semiconductor substrate, the diffusion region being formed in a well diffusion region of opposite conductivity type to that of the semiconductor substrate.

8. A semiconductor variable capacitance element as claimed in claim 1; including protective means for protecting the insulating film from electrostatic discharge.

9. A semiconductor variable capacitance element as claimed in claim 8; wherein the protective means comprises a resistance connected in parallel between the charge control electrode and the semiconductor substrate.

10. A semiconductor variable capacitance element as claimed in claim 1; wherein the blocking means comprises a plurality of MOS capacitance electrodes formed in the insulating film.

11. A semiconductor variable capacitance element as claimed in claim 1; wherein the floating electrode has a first portion parallel to and overlying the charge control electrode and a second portion parallel to and underlying the first capacitance electrode.

12. A semiconductor variable capacitance element as claimed in claim 11; wherein the second portion of the floating electrode is substantially longer than the first portion of the floating electrode.

13. A semiconductor variable capacitance element as claimed in claim 11; wherein the first and second portions of the floating electrode are substantially coplanar.

14. A semiconductor variable capacitance element as claimed in claim 13; wherein the floating electrode has a third portion interconnecting the first and second portions thereof, the third portion not being coplanar with the first and second portions.

15. A semiconductor variable capacitance element as claimed in claim 1; wherein the charge control electrode is electrically insulated from the floating electrode through the insulating film.

* * * * *